(12) United States Patent
Scheiper et al.

(10) Patent No.: US 8,409,942 B2
(45) Date of Patent: Apr. 2, 2013

(54) REPLACEMENT GATE APPROACH BASED ON A REVERSE OFFSET SPACER APPLIED PRIOR TO WORK FUNCTION METAL DEPOSITION

(75) Inventors: Thilo Scheiper, Dresden (DE); Sven Beyer, Dresden (DE); Uwe Griebenow, Markkleeberg (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 12/914,570

(22) Filed: Oct. 28, 2010

(65) Prior Publication Data
US 2011/0186915 A1  Aug. 4, 2011

(30) Foreign Application Priority Data
Jan. 29, 2010 (DE) .......................... 10 2010 001 403

(51) Int. Cl.
*H01L 21/336* (2006.01)
(52) U.S. Cl. ................ 438/197; 438/183; 257/E21.409; 257/E21.453
(58) Field of Classification Search .................. 438/183, 438/197; 257/E21.409, E21.453
See application file for complete search history.

(56) References Cited

U.S. PATENT DOCUMENTS

| | | | | |
|---|---|---|---|---|
| 5,960,270 A * | 9/1999 | Misra et al. | ................... | 438/197 |
| 6,395,589 B1 * | 5/2002 | Yu | ................... | 438/183 |
| 6,559,051 B1 * | 5/2003 | Buynoski et al. | ............ | 438/678 |
| 6,908,822 B2 * | 6/2005 | Rendon et al. | ............... | 438/303 |
| 7,521,314 B2 * | 4/2009 | Jawarani et al. | .............. | 438/230 |
| 8,093,117 B2 * | 1/2012 | Tsau et al. | ................... | 438/183 |
| 2004/0203198 A1 | 10/2004 | Cho et al. | ....................... | 438/200 |
| 2004/0266081 A1 * | 12/2004 | Oh et al. | ....................... | 438/197 |
| 2005/0112811 A1 * | 5/2005 | Hsu et al. | ....................... | 438/197 |
| 2005/0153494 A1 * | 7/2005 | Ku et al. | ....................... | 438/197 |
| 2005/0221548 A1 * | 10/2005 | Doyle et al. | .................. | 438/197 |
| 2006/0091432 A1 | 5/2006 | Guha et al. | .................... | 257/288 |
| 2008/0026519 A1 * | 1/2008 | Liu et al. | ....................... | 438/197 |
| 2008/0070356 A1 * | 3/2008 | Brown et al. | ................. | 438/197 |
| 2009/0212332 A1 * | 8/2009 | Wang et al. | ................... | 257/288 |

* cited by examiner

*Primary Examiner* — Alexander Ghyka
*Assistant Examiner* — Stanetta Isaac
(74) *Attorney, Agent, or Firm* — Williams, Morgan & Amerson, P.C.

(57) ABSTRACT

In a replacement gate approach, a spacer may be formed in the gate opening after the removal of the placeholder material, thereby providing a superior cross-sectional shape upon forming any electrode metals in the gate opening. Moreover, the spacer may be used for reducing the gate length, while not requiring more complex gate patterning strategies.

20 Claims, 5 Drawing Sheets

REPLACEMENT GATE APPROACH BASED ON A REVERSE OFFSET SPACER APPLIED PRIOR TO WORK FUNCTION METAL DEPOSITION

BACKGROUND OF THE INVENTION

1. Field of the Invention

Generally, the present disclosure relates to the fabrication of sophisticated integrated circuits including transistor elements comprising gate structures formed on the basis of a high-k gate dielectric material in combination with a metal electrode material.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, CMOS technology is one of the most promising approaches due to the superior characteristics in view of operating speed and/or power consumption and/or cost efficiency. During the fabrication of complex integrated circuits using, for instance, CMOS technology, millions of transistors, i.e., N-channel transistors and P-channel transistors, are formed on a substrate including a crystalline semiconductor layer. A field effect transistor, irrespective of whether an N-channel transistor or a P-channel transistor is considered, typically comprises so-called PN junctions that are formed by an interface defined by highly doped regions, referred to as drain and source regions, and a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the conductivity of the channel region substantially affects the performance of MOS transistors.

Presently, the vast majority of integrated circuits are based on silicon due to substantially unlimited availability, the well-understood characteristics of silicon and related materials and processes and the experience gathered during the last 50 years. Therefore, silicon will likely remain the material of choice for future circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide has been preferably used as a base material of a gate insulation layer that separates the gate electrode, frequently comprised of polysilicon or metal-containing materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage, and thus reduced threshold voltage, may suffer from an exponential increase of the leakage current, since the thickness of the silicon dioxide layer has to be correspondingly reduced to provide the required capacitance between the gate and the channel region. For example, a channel length of approximately 0.08 µm may require a gate dielectric made of silicon dioxide as thin as approximately 1.2 nm. Although, generally, usage of high speed transistor elements having an extremely short channel may be substantially restricted to high speed signal paths, whereas transistor elements with a longer channel may be used for less critical signal paths, such as storage transistor elements, the relatively high leakage current caused by direct tunneling of charge carriers through an ultra-thin silicon dioxide gate insulation layer may reach values for an oxide thickness in the range of 1-2 nm that may not be compatible with thermal design power requirements for performance driven circuits.

Therefore, replacing silicon dioxide based dielectrics as the material for gate insulation layers has been considered. Possible alternative materials include materials that exhibit a significantly higher permittivity so that a physically greater thickness of a correspondingly formed gate insulation layer provides a capacitive coupling that would be obtained by an extremely thin silicon dioxide layer.

It has thus been suggested to replace silicon dioxide with high permittivity materials such as tantalum oxide ($Ta_2O_5$), strontium titanium oxide ($SrTiO_3$), hafnium oxide ($HfO_2$), HfSiO, zirconium oxide ($ZrO_2$) and the like.

Additionally, transistor performance may be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance, while additionally maintaining leakage currents at an acceptable level. On the other hand, the non-polysilicon material, such as titanium nitride and the like, in combination with other metals, may be formed so as to directly connect to the high-k dielectric material, thereby substantially avoiding the presence of a depletion zone. Since the threshold voltage of the transistors, which represents the voltage at which a conductive channel forms in the channel region, is significantly determined by the work function of the metal-containing gate material, an appropriate adjustment of the effective work function with respect to the conductivity type of the transistor under consideration has to be guaranteed.

Providing different metal species for adjusting the work function of the gate electrode structures for P-channel transistors and N-channel transistors at an early manufacturing stage may, however, be associated with a plurality of difficulties, which may stem from the fact that a complex patterning sequence may be required during the formation of the sophisticated high-k metal gate stack, thereby likely resulting in a significant variability of the work function and thus threshold voltage of the transistor structures. For instance, a shift of the work function may be observed when forming appropriate work function metals in an early manufacturing stage, which is believed to be caused by a moderately high oxygen affinity of the metal species, in particular during high temperature processes which may typically be required for completing the transistor structures, for instance for forming drain and source regions and the like.

For this reason, in some alternative approaches, the initial gate electrode stack may be provided with a high degree of compatibility with conventional polysilicon-based process strategies and the actual electrode metal and the final adjustment of the work function of the transistors may be accomplished in a very advanced manufacturing stage, i.e., after completing the basic transistor structure.

According to this replacement gate approach, in particular, any threshold variations caused by high temperature processes and the like may be efficiently avoided, thereby contributing to superior uniformity of sophisticated transistor elements. In the replacement gate approach, the polysilicon material is removed on the basis of appropriate etch recipes, such as wet chemical etch processes, which exhibit a high degree of selectivity with respect to the insulating material that laterally delineates the polysilicon material. After the removal of the polysilicon material, an appropriate metal-containing material is deposited in order to form the work function adjusting species above the gate dielectric material as explained above. Typically, P-channel transistors and N-channel transistors require different types of work function adjusting species, which necessitates a corresponding masking and patterning regime in order to appropriately form the desired work function adjusting material in the gate electrode structures of P-channel transistors and N-channel transistors, respectively. Irrespective of the applied process strategy, after depositing the work function adjusting material layer, at least the actual electrode metal, such as aluminum, has to be filled into the opening, the width of which may, however, be further reduced by the previous deposition of the work function adjusting material, thereby causing significant irregularities.

Since typically at least one of the electrode metals may be deposited on the basis of physical vapor deposition techniques, it is extremely difficult to avoid corresponding material overhangs at the top of the gate opening, which may, thus, result in an incomplete filling of the remaining gate opening upon depositing any further materials, such as a further work function metal species or the actual electrode metal. On the other hand, the physical component for providing superior directionality during the physical vapor deposition process may not be further increased without causing a significant risk of damaging sensitive materials, such as a high-k dielectric material and the like, or causing penetration of metal species into the channel region of the transistor. Consequently, upon further reducing the critical dimensions of sophisticated transistors, not only the lithography and patterning sequence for providing the placeholder gate electrode structure may significantly increase in complexity, but also the further reduced dimensions of the gate opening or gate trench provided in a late manufacturing stage may increasingly result in deposition-related irregularities caused by the physical vapor deposition techniques that are applied in introducing at least one metal species, such as a work function species, into the very critical gate openings. Thus, significant transistor variabilities may be induced in a late manufacturing stage or substantially non-functional gate electrodes may be obtained, thereby significantly contributing to yield losses.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally provides semiconductor devices and manufacturing techniques in which the topography of the resulting gate openings or trenches in a replacement gate approach may be made less critical by providing a spacer element on inner sidewalls of the gate opening prior to actually filling in a metal species, such as a work function metal, an electrode metal and the like. The spacer, which may also be referred to as a reverse spacer, thus, has oppositely arranged side portions with outer surface areas facing each other within the gate opening, wherein a width of the reverse spacer may increase with increasing depth within the gate opening, thereby providing a tapered cross-sectional shape of the gate opening, which may, thus, enable a significantly less critical deposition process, even if physical vapor deposition processes may be applied. The reverse spacer may be provided in the form of any appropriate material, such as a dielectric material, which may be deposited on the basis of highly conformal deposition techniques, while, in other illustrative aspects, conductive materials may be used, wherein any disadvantages of the cross-sectional shape of the depositing of the spacer layer, for instance in the form of any overhangs, may be efficiently removed upon the subsequent etch process in order to remove the spacer material from the bottom of the gate opening, thereby also generating the desired cross-sectional shape, i.e., the tapering shape with increased spacer width at the bottom of the gate opening. Consequently, the probability of creating deposition-related irregularities upon filling in any conductive electrode materials may be significantly reduced. Furthermore, the desired target gate length may be efficiently adjusted on the basis of the reverse spacer, while avoiding additional complexity upon patterning the replacement gate electrode structure in an early manufacturing stage. Thus, the critical dimensions, i.e., the gate length of transistors, may be efficiently reduced without unduly contributing to increased process complexity in terms of patterning the gate electrode structure. Moreover, integrity of sensitive materials, in particular at the edge of the gate opening, may be enhanced upon forming the reverse spacer element in the gate opening.

One illustrative method disclosed herein comprises forming an opening in a gate electrode structure of a transistor by removing a placeholder electrode material of the gate electrode structure. The method further comprises forming a spacer on sidewalls of the opening and forming a conductive electrode material in the opening in the presence of the spacer.

A further illustrative method disclosed herein comprises forming a gate electrode structure of a transistor on a semiconductor region, wherein the gate electrode structure comprises a placeholder material having a first gate length. The method additionally comprises forming drain and source regions in the semiconductor region so as to comply with a second gate length that is less than the first gate length. Moreover, the method comprises forming an opening in the gate electrode structure by removing at least the placeholder material and forming a spacer in the opening so as to reduce the lateral dimensions of the opening. The method further comprises forming a conductive electrode material in the opening, wherein the conductive electrode material has the second gate length.

One illustrative transistor disclosed herein comprises a gate electrode structure formed on a semiconductor region. The gate electrode structure comprises a gate insulation layer comprising a high-k dielectric material and a reverse spacer that laterally encloses an electrode metal.

BRIEF DESCRIPTION OF THE DRAWINGS

The disclosure may be understood by reference to the following description taken in conjunction with the accompanying drawings, in which like reference numerals identify like elements, and in which.

Figure 1A:
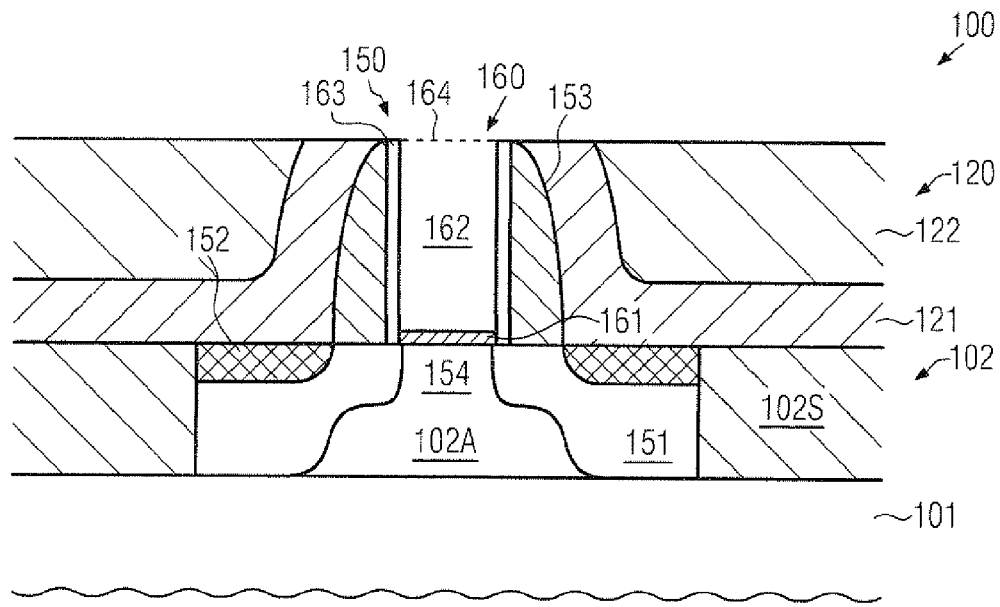
FIGS. 1a-1f schematically illustrate cross-sectional views of a semiconductor device during various manufacturing stages in applying a replacement gate approach on the basis of a reverse spacer formed in a gate opening prior to filling in highly conductive electrode metal, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides semiconductor devices and manufacturing techniques in which sophisticated high-k metal gate electrode structures may be provided on the basis of a replacement gate approach, wherein at least a highly conductive electrode metal may be provided in a late manufacturing stage by replacing a gate material, such as polysilicon and the like. In order to provide a superior cross-sectional shape of the gate opening and/or in order to reduce a gate length of the gate electrode structure, an inner spacer or reverse spacer may be formed in the gate opening prior to filling critical materials, such as work function metals, fill metals and the like. By providing the spacer on inner sidewalls of the gate opening, a less critical cross-sectional shape along the length direction of the transistor may be accomplished, since the resulting gate opening may have a tapered cross-sectional shape, which may, thus, reduce the influence of any overhangs, as may typically be created upon applying physical vapor deposition techniques. To this end, the spacer material may be deposited on the basis of any appropriate deposition process, such as chemical vapor deposition (CVD), plasma assisted CVD, multilayer CVD and the like, and also by physical vapor deposition techniques, wherein, in some illustrative embodiments, a very conformal material layer, in the form of a dielectric material, such as silicon dioxide, silicon nitride and the like, may be provided, which may then be etched into the reverse spacer elements by using appropriate anisotropic etch techniques. Due to the nature of the etch process, the width of the spacer may increase towards the bottom of the gate opening, thereby providing the desired tapered cross-sectional shape that results in the superior deposition conditions during the subsequent processing. In other cases, even a less conformal deposition of the spacer material, that is, the creation of certain overhangs at the top of the gate opening, may be efficiently compensated for during the subsequent spacer etch process, thereby finally obtaining the desired tapering shape of the spacer elements. Furthermore, during the spacer etch process, a desired degree of over-etching may be applied, thereby even further contributing to a corner rounding at the top of the gate openings, which may thus even further enhance a subsequent deposition of work function metals, electrode fill metals, high-k dielectric materials, if required, and the like. Furthermore, the superior cross-sectional shape may generally enhance the further processing, since, frequently, different work function metal species may have to be deposited and subsequently be partially removed from some gate electrode structures, followed by the deposition of another work function metal species, which may conventionally result in even further sophisticated deposition conditions, which in turn may even more strongly contribute to transistor variabilities and/or yield losses.

Furthermore, by providing the reverse spacer in the gate opening prior to depositing the metal materials, in some illustrative embodiments, superior integrity of bottom edges of the gate electrode structures may be achieved, for instance in approaches which may provide the high-k dielectric material and an appropriate conductive cap material in an early manufacturing stage. That is, in some approaches, the high-k dielectric material, in combination with a conductive cap material, may be provided upon patterning the gate electrode structure, wherein aggressive cleaning processes and the like may contribute to a certain degree of material erosion, in particular at the gate edges, which may then be reliably covered by the reverse spacer prior to incorporating the replacement gate metals.

Furthermore, in some illustrative aspects disclosed herein, the reverse spacer may also be efficiently used for adjusting a desired target gate length, without requiring an increase of process complexity during the patterning of the gate electrode structure at an early manufacturing stage. In this case, well-established process techniques may be applied to form the gate electrode structure in an early manufacturing phase on the basis of a first gate length that is greater than the desired final gate length. Thereafter, the processing may be continued on the basis of appropriate process techniques, wherein, in particular, the formation of the drain and source regions may be specifically designed such that the desired final gate length may be complied with, for instance, by adapting offset spacers and any spacer structures in combination with implantation processes and anneal processes, thereby forming the drain and source regions with an increased overlap with the gate electrode structure. Consequently, upon removing the placeholder electrode material and forming the reverse spacer in the resulting gate opening, the previously formed drain and source regions may have the appropriate channel length to comply with the gate length as defined by the reverse spacer elements. At the same time, superior deposition conditions may be achieved, as explained above, thereby providing a complex high-k metal gate electrode structure with a desired reduced gate length, while at the same time increased complexity of the gate patterning process may be avoided and production yield may be maintained at a desired high level.

FIG. 1a schematically illustrates a cross-sectional view of a semiconductor device 100 comprising a transistor 150 in an advanced manufacturing stage. As illustrated, the transistor 150 may be formed in and above an active region 102A, which may be understood as a semiconductor region provided in a semiconductor layer 102 and delineated laterally therein by an appropriate isolation structure 102S. The semiconductor layer 102 may be provided above a substrate 101, such as a semiconductor substrate, an insulating substrate and the like. The semiconductor layer 102 may be comprised of any appropriate semiconductor material, such as silicon, silicon/germanium and the like, wherein, as previously discussed, typical silicon-based materials may be used for sophisticated integrated circuits. Furthermore, the substrate 101 and the semiconductor layer 102 may represent a "bulk" configuration, i.e., the semiconductor layer 102 may be directly formed on a crystalline semiconductor material of the substrate 101. In other cases, a silicon- or semiconductor-on-insulator (SOI) configuration may be provided, at least locally within the semiconductor device 100, when a buried insulating layer (not shown) may vertically delineate the active region 102A. Moreover, in the manufacturing stage shown, the transistor 150 may comprise drain and source regions 151, which may laterally enclose a channel region 154 having a desired gate length, i.e., a minimum lateral distance between drain and source regions 151. It should be appreciated that the length direction of the transistor 150 is represented by the horizontal direction in FIG. 1a and, thus, also represents the general current flow direction in the channel region 154. Moreover, metal silicide regions 152 may be provided in a portion of the drain and source regions 151. It should be noted that additional materials may be incorporated into the active region 102A, for instance strain-inducing semiconductor materials and the like, which may create a desired type of strain in the channel region 154 in order to appropriately modify the charge carrier mobility and, thus, the overall conductivity therein.

Moreover, in the manufacturing stage shown, the transistor 150 may comprise a gate electrode structure 160, which, in some illustrative embodiments, may include a gate dielectric material 161 or at least a portion thereof, while, in other cases, the material 161 may represent a placeholder material, which may be used as an etch stop material in the preceding processing. For example, the material 161 may comprise a silicon dioxide based material and the like. Moreover, a liner material 163, such as a silicon nitride material, may be formed and may have been provided so as to maintain integrity of other gate materials and/or act as an offset spacer upon establishing the vertical and lateral dopant profile of the drain and source regions 151. Moreover, on sidewalls of the gate electrode structure 160, a spacer structure 153 may be provided, which may have any appropriate configuration so as to act as an implantation mask upon forming the drain and source regions 151. In the manufacturing stage shown, a gate opening or trench 162 may be provided in the gate electrode structure 160, which may be accomplished upon removing a placeholder electrode material, indicated by 164 in the form of the dashed lines in FIG. 1a. Moreover, the gate electrode structure 160 may be laterally embedded in a dielectric material 120, for instance provided as a portion of an interlayer dielectric material comprising any appropriate material layers, such as layers 121 and 122. For example, in some approaches, at least a portion of the material 120 may comprise a highly stressed material in order to induce a desired type of strain in the channel region 154, thereby also enhancing performance of the transistor 150.

The semiconductor device 100 as illustrated in FIG. 1a may be formed on the basis of any appropriate process technique, for example, the active region 102A may be formed in the semiconductor layer 102 by providing the isolation structure 102S, for instance in the form of a shallow trench isolation, by using any appropriate process strategy. Furthermore, if required, a basic doping profile may be established in the active region 102A in accordance with the overall desired transistor characteristics. Thereafter, a material layer stack comprising at least the materials 161 and 164, possibly in combination with additional materials, such as dielectric cap layers, hard mask materials and the like, may be formed by any appropriate deposition technique and may be subsequently patterned by using sophisticated lithography and etch techniques. Thereafter, the offset spacer or liner 163 may be formed, for instance by depositing a silicon nitride material, a silicon dioxide material and the like with a thickness as required for defining a desired offset from the placeholder material 164 during the further processing. Thereafter, additional spacer elements of the structure 153 may be formed, if required, for acting as an implantation mask followed by a further implantation sequence based on the spacer structure 153 so as to obtain the drain and source regions 151 with a desired dopant profile. It should be appreciated that, as discussed above, in some embodiments, strain-inducing semiconductor alloy (not shown) may be incorporated into the active region 102A, for instance by forming cavities based on the offset spacer 163 and refilling the cavities by any appropriate material, such as a silicon/germanium mixture and the like.

After incorporating the drain and source dopant species, any anneal processes may be performed so as to obtain the finally desired dopant profile and activate the dopant species. Next, the metal silicide region 152 may be formed on the basis of any appropriate process techniques. After completing the basic transistor configuration, the material 120 may be formed, for instance by depositing the layers 121 and 122 by using any appropriate process technique, followed by a planarization process, such as a chemical mechanical polishing (CMP) process, thereby also exposing the material 164, which may be subsequently removed on the basis of any appropriate etch strategy, for instance by using wet chemical etch processes, plasma assisted etch processes or any combination thereof. In the embodiment shown, the removal of the material 164 may be performed such that the layer 161 may act as an efficient etch stop material, which, in some illustrative embodiments, may also be removed and may be replaced by any other appropriate dielectric material, such as silicon dioxide, silicon oxynitride and the like. To this end, oxidation techniques and the like may be applied. In other cases, the layer 161 may represent a portion of a gate dielectric material for which an additional high-k dielectric material may be provided in a later manufacturing stage.

Figure 1B:
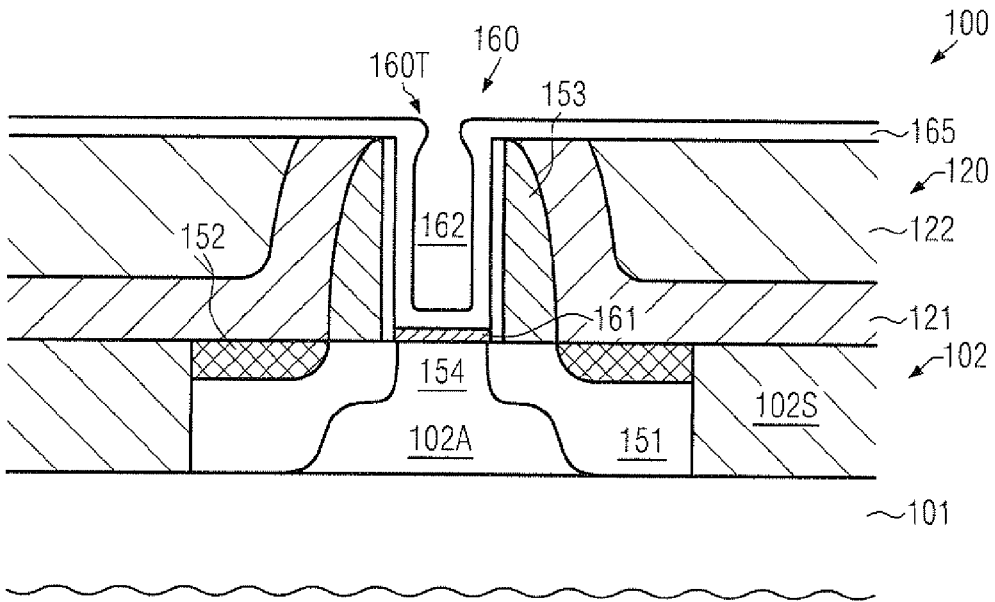

FIG. 1b schematically illustrates the semiconductor device 100 in a further advanced manufacturing stage in which a spacer layer 165 may be formed on the dielectric material 120 and within the gate opening 162. In the embodiment shown, the spacer layer 165 may have a certain overhang at a top area 160T of the gate electrode structure 160, which may be caused by the deposition of the material of the layer 165. In other cases, the layer 165 may be provided in the form of a highly conformal spacer material, for instance in the form of a silicon nitride material, a silicon dioxide material and the like, for which very conformal and well-controllable deposition techniques are available. For example, silicon nitride may be deposited on the basis of low pressure CVD and/or multilayer CVD with any appropriate thickness of less than one nanometer to several nanometers with a thickness variation of approximately less than 5%. Consequently, a thickness of the layer 165 may be appropriately selected so as to obtain a desired reduced lateral dimension of the gate opening 162 along the length direction, i.e., along the horizontal direction in FIG. 1b.

Figure 1C:
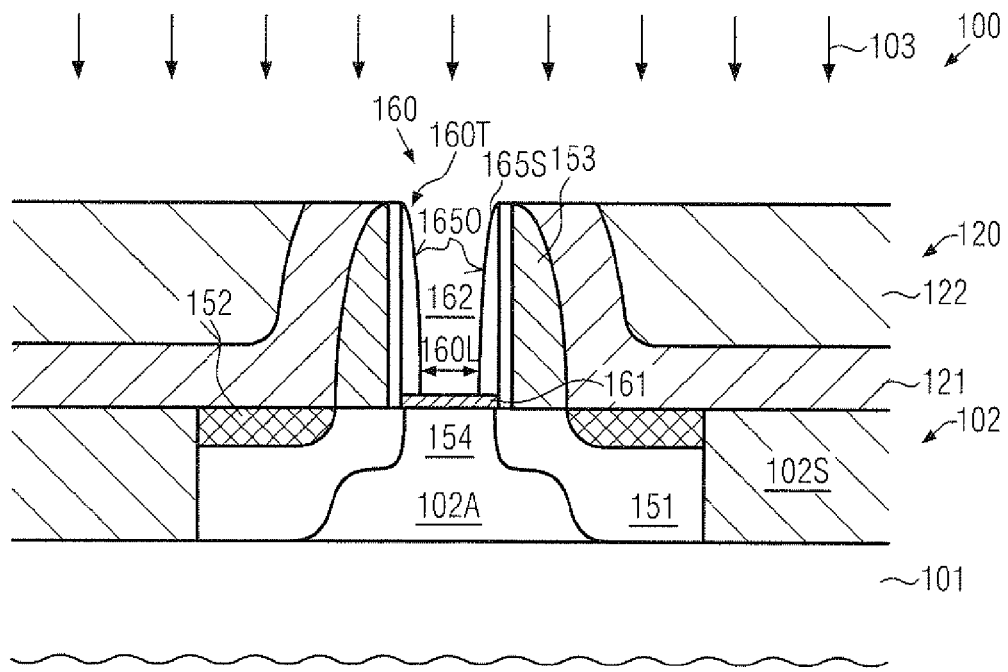

FIG. 1c schematically illustrates the semiconductor device 100 during a plasma assisted etch process 103. During the etch process 103, the material of the spacer layer 165 (FIG. 1b) may preferably be removed from horizontal device areas, thereby forming a spacer element 165S within the opening 162. It should be appreciated that a plurality of plasma assisted etch recipes are available for a plurality of materials, such as silicon nitride, silicon dioxide, metal materials and the like. For instance, when providing the spacer 165S in the form of a silicon nitride material, well-established silicon nitride etch recipes may be applied. Generally, the etch rate may be higher at the top area 160T compared to the bottom of the opening 162, which may, thus, result in a significant material removal of the spacer 165S, thereby imparting a reduced width to the spacer 165S at the top area 160T. Consequently, the resulting gate opening 162 including the spacer 165S has a tapered cross-sectional shape, wherein the spacing between the outer surface areas 165O, which are oppositely arranged to each other within the gate opening 162 with respect to the length direction, may result in a reduced gate length 160L, which is shortest at the bottom of the opening 162. The spacer 165S having the varying width and formed within the gate opening 162 will also be referred to herein as a reverse spacer.

It should be appreciated that the etch process 103 may be continued to provide an even further pronounced material erosion, preferably at the top area 160T, thereby even further increasing the degree of corner rounding in this area. In other cases, an additional etch step or any other material removal process, such as ion sputtering and the like, may additionally be applied to further increase a degree of corner rounding at the top area 160T.

Figure 1D:
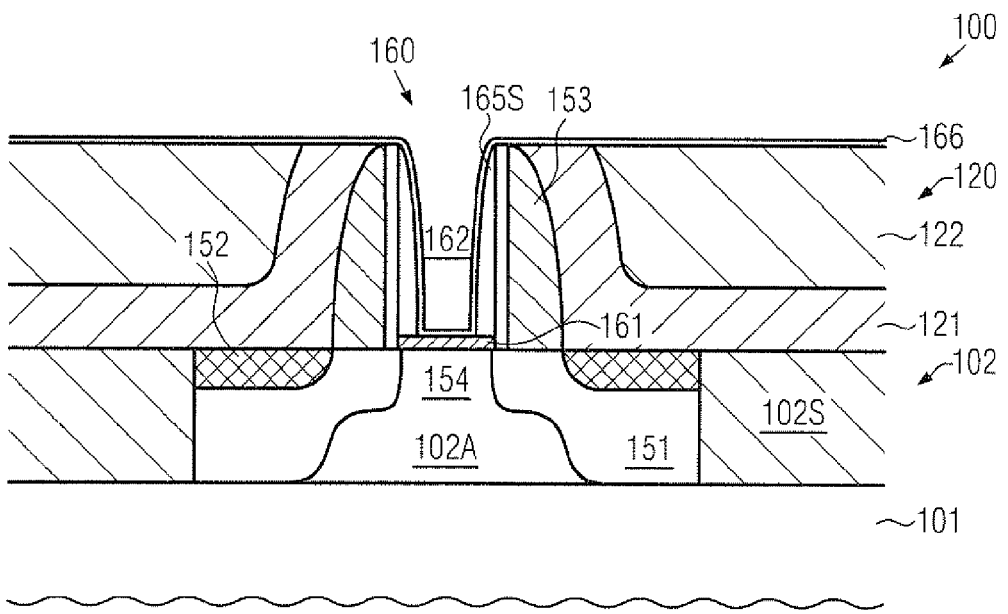

FIG. 1d schematically illustrates the semiconductor device 100 with a dielectric material 166 formed on the dielectric material 120 and within the opening 162, which includes the reverse spacer 165S. In the embodiment shown, the layer 161 or any replacement material may still be present in the opening 162, while, in other cases, the material 161 may have been removed prior to forming the spacer 165S as discussed above, or at least an exposed portion thereof may have been removed after forming the reverse spacer 165S. The dielectric layer 166 may comprise a high-k dielectric material, such as hafnium oxide and the like, in order to provide an appropriate thickness so as to maintain leakage currents of the gate electrode structure 160 at an acceptable level, while nevertheless providing a desired high capacitive coupling, as explained above. The deposition of the layer 166 may be accomplished on the basis of any appropriate CVD-based technique, for which a plurality of recipes are available.

Figure 1E:
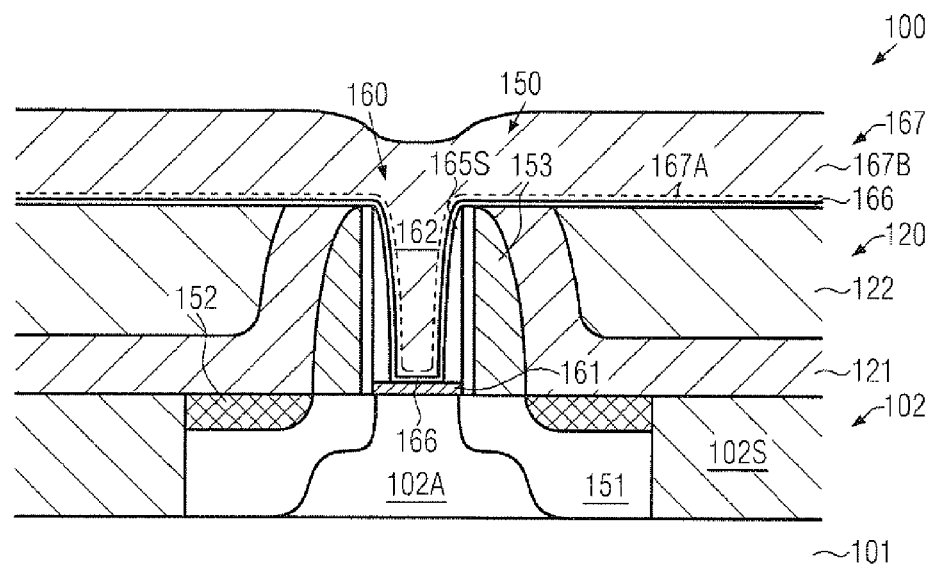

FIG. 1e schematically illustrates the semiconductor device 100 in a further advanced manufacturing stage. As illustrated, a conductive electrode material 167 may be formed in the opening 162 and above the dielectric material 120. The electrode material 167 may comprise any appropriate material or materials so as to obtain the desired electronic characteristics of the gate electrode structure 160. For instance, the material 167 may comprise the material layer 167A including a specific work function metal species so as to obtain a desired work function for the transistor under consideration. That is, frequently, specific work function metals may be applied, for instance in the form of aluminum, lanthanum, titanium nitride, tantalum and the like, so as to obtain, in combination with further materials, such as dielectric material 161 if provided, and the material 166 including the high-k dielectric material, which may act as a gate insulation layer, the required threshold characteristics of the transistor 150. It should be appreciated that, depending on the overall process strategy, the layer 167A may comprise two or more individual sublayers, for instance in the form of barrier materials and the like, depending on the process strategy for applying appropriate work function metals for different types of transistors. Moreover, the electrode material 167 may comprise a fill metal 167B, such as aluminum or any other appropriate highly conductive material. As previously explained, generally, superior deposition conditions may be achieved on the basis of the tapered cross-sectional shape of the opening 162 due to the presence of the reverse spacer 165S, thereby avoiding or at least significantly reducing the probability of creating deposition-related irregularities. In particular, when physical vapor deposition techniques may be applied, for instance for providing the material layer 167A, the negative influence of any overhangs may be significantly reduced.

Figure 1F:
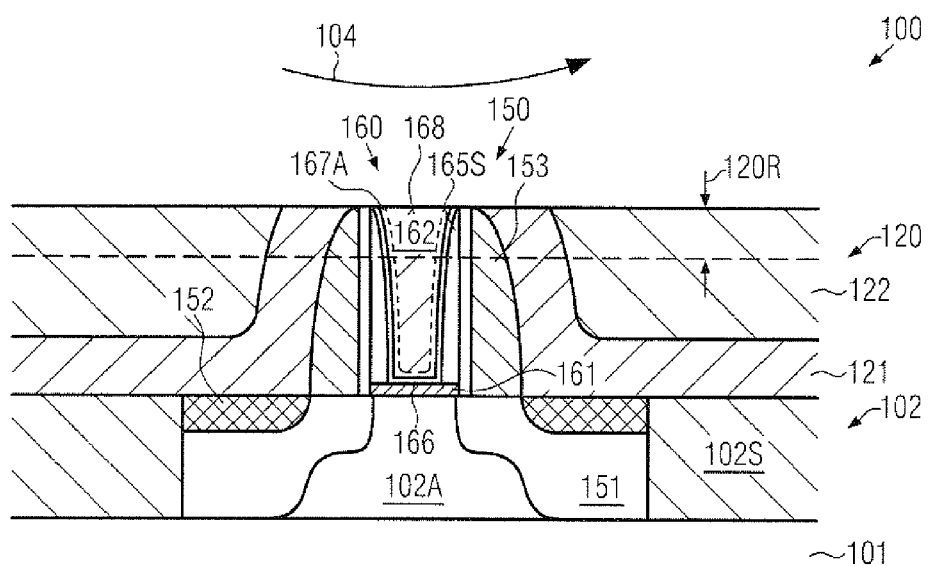

FIG. 1*f* schematically illustrates the semiconductor device 100 in a further advanced manufacturing stage in which any excess material may be removed on the basis of any appropriate removal process 104. For example, a CMP process may be applied so as to remove excess materials of the layers 167 and 166 (FIG. 1*e*), wherein, depending on the overall process strategy, the planarization process may be continued so as to also remove a portion of the material 120, as indicated by 120R, thereby adjusting the final height of the gate electrode structure 160. The gate electrode structure 160 may, thus, comprise a gate dielectric material 168, which may be represented by the material 166 comprising a high-k dielectric material, possibly in combination with the dielectric material 161, if provided. Furthermore, the electrode material may be provided, which may, as discussed above, comprise any appropriate work function metal or other materials in the form of the layer 167A, if required.

Figure 1G:
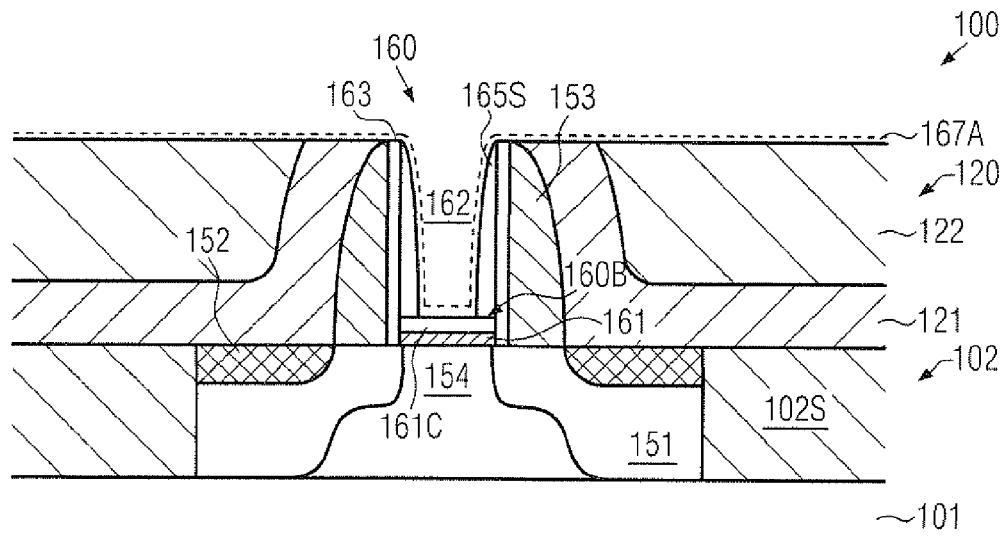
FIG. 1g schematically illustrates a cross-sectional view of the semiconductor device according to further illustrative embodiments in which a reverse spacer may be formed in a gate opening in the presence of a high-k dielectric material, possibly in combination with a conductive cap material.

FIG. 1*g* schematically illustrates the semiconductor device 100 according to further illustrative embodiments in which the gate electrode structure 160 may comprise the dielectric material 161 so as to include a high-k dielectric material, while a conductive cap material 161C, for instance in the form of titanium nitride, may be formed on the gate dielectric material 161. To this end, during the patterning process of the gate electrode structure 160, an appropriate material layer stack may be provided that may include the dielectric material 161, which may be comprised of a conventional dielectric material in combination with a high-k dielectric material. Thereafter, the conductive cap layer 161C may be formed and may include additional metal species, such as lanthanum, aluminum and the like, if required. In other cases, an appropriate work function metal species may be incorporated in the dielectric layer 161, which may be accomplished by performing any appropriate heat treatment prior to actually patterning the gate electrode structure 160, thereby adjusting the work function of at least one type of transistor in an early manufacturing stage. Thereafter, the further processing may be continued on the basis of any appropriate process technique, thereby forming the transistor 150, as is also previously described, and finally forming the gate opening 162, wherein the conductive cap material 161C may act as an efficient etch stop material. Thereafter, the reverse spacer 165S may be formed by using process techniques as discussed above. Consequently, also in this case, the gate opening 162 may have a superior cross-sectional shape.

In some illustrative embodiments, the reverse spacer 165S may, thus, seal the bottom edges 160B of the gate electrode structures 160 and may be formed by any appropriate dielectric material, thereby compensating for any material losses at the edges 160B during the preceding processing, for instance when exposing the gate electrode structure to aggressive cleaning processes, in which integrity of the liner 163 may have been violated. In this case, a superior cross-sectional shape of the opening 162 may be provided and any metal incorporation into the gate dielectric material 161 and into the channel region 154 via potentially damaged edges of the area 160B may be efficiently suppressed by the spacer 165S, while the effective gate length may not be substantially affected by the spacer 165S, since the conductive cap layer 161C may electrically connect to a further electrode metal, such as a work function species 167A and actual fill electrode metal and the like.

In other illustrative embodiments, the spacer 165S may be formed on the basis of a conductive material, such as titanium nitride, tantalum nitride and the like, which may have a high stability and which may, thus, also efficiently seal any damaged areas at the edges 160B of the gate electrode structure 160. As previously discussed, even if a corresponding spacer layer for the spacers 165S may have to be provided on the basis of physical vapor deposition techniques, any overhangs may be efficiently removed during the subsequent etch process, wherein, depending on the material composition of the layer 165S, the conductive cap layer 161C may be removed, at least partially, while, in other cases, this material may act as an efficient etch stop material. Consequently, the superior cross-sectional shape of the opening 162 may be obtained by the spacers 165S, while the overall conductivity of the gate electrode structure 160 may not be significantly influenced by the presence of the spacers 165S due to a moderately high conductivity thereof.

After forming the spacer element 165S, the further processing may be continued, as described above.

Figure 1H:
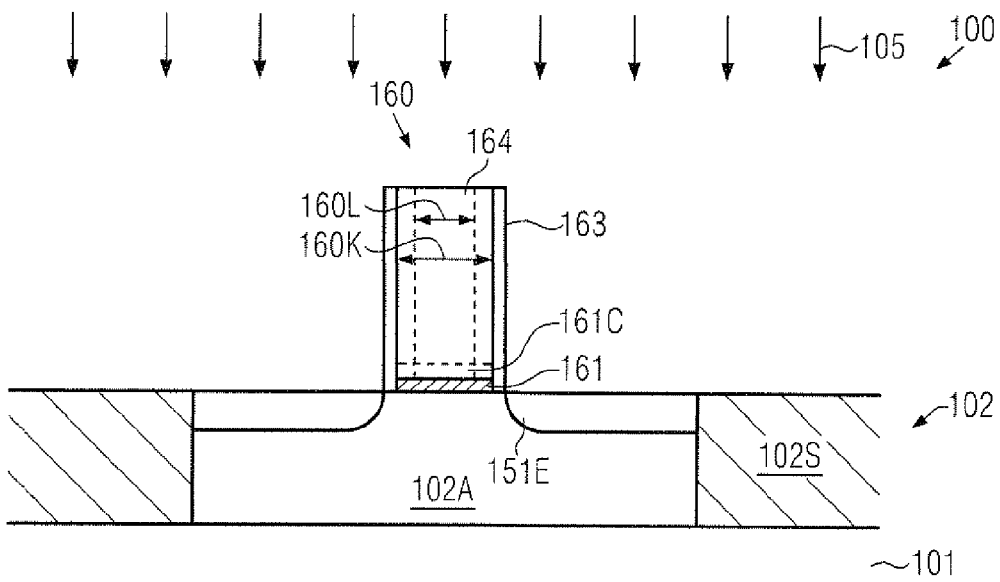
FIGS. 1h-1j schematically illustrate cross-sectional views of the semiconductor device during various earlier manufacturing stages in forming drain and source regions so as to comply with a gate length that is substantially determined by the reverse spacer to be formed in a later manufacturing stage upon replacing the placeholder material in the gate electrode structure by an electrode material, according to further illustrative embodiments.

FIG. 1*h* schematically illustrates the semiconductor device 100 in an early manufacturing stage. As illustrated, the gate electrode structure 160 may comprise the placeholder material 164, for instance in the form of a silicon material, which may have a length 160K which may be greater compared to a desired target gate length 160L, which is to be established on the basis of a reverse spacer upon replacing the material 164 in a later manufacturing stage. Consequently, the gate electrode structure 160 may be patterned on the basis of any appropriate material layer system, for instance comprising the gate dielectric material 161, possibly including a high-k dielectric material, and possibly comprising a conductive cap material 161C, as is also discussed above, wherein the patterning process may be accomplished on the basis of less critical lithography and etch conditions compared to a strategy in which the final gate length 160L may have to be implemented on the basis of the placeholder material 164. Furthermore, any offset spacer elements 163 may be provided with a reduced width when, for instance, less pronounced protection may be required, as discussed above, while, at the same time, a reduced lateral offset of drain and source extension regions 151E may be achieved. That is, in an ion implantation process 105 for incorporating the dopant species of the extension regions 151E, appropriate parameters may be used, for instance by providing a tilt angle and/or reducing the width of the offset spacer elements 163 and the like in order to adjust the lateral offset in view of the finally desired gate length 160L.

Figure 1I:
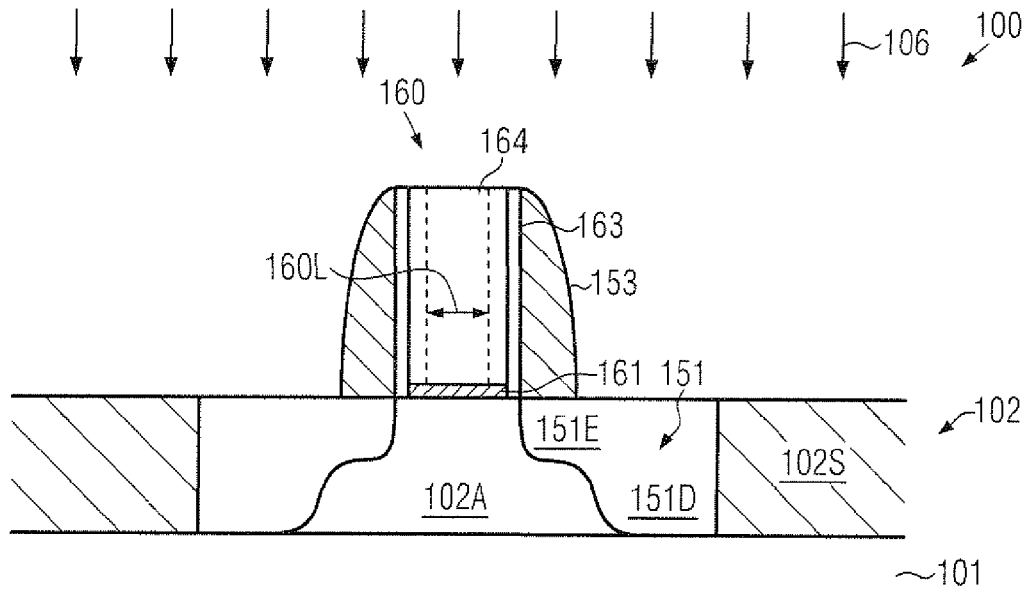

FIG. 1*i* schematically illustrates the semiconductor device 100 in a further advanced manufacturing stage in which the spacer structure 153 may be provided so as to have a desired width in order to form deep drain and source areas 151D of the drain and source regions 151 so as to appropriately connect to the drain and source extension regions 151E. Also in this case, the spacer structure 153 is appropriately dimensioned so as to comply with the final gate length 160L of the gate electrode structure 160.

Figure 1J:
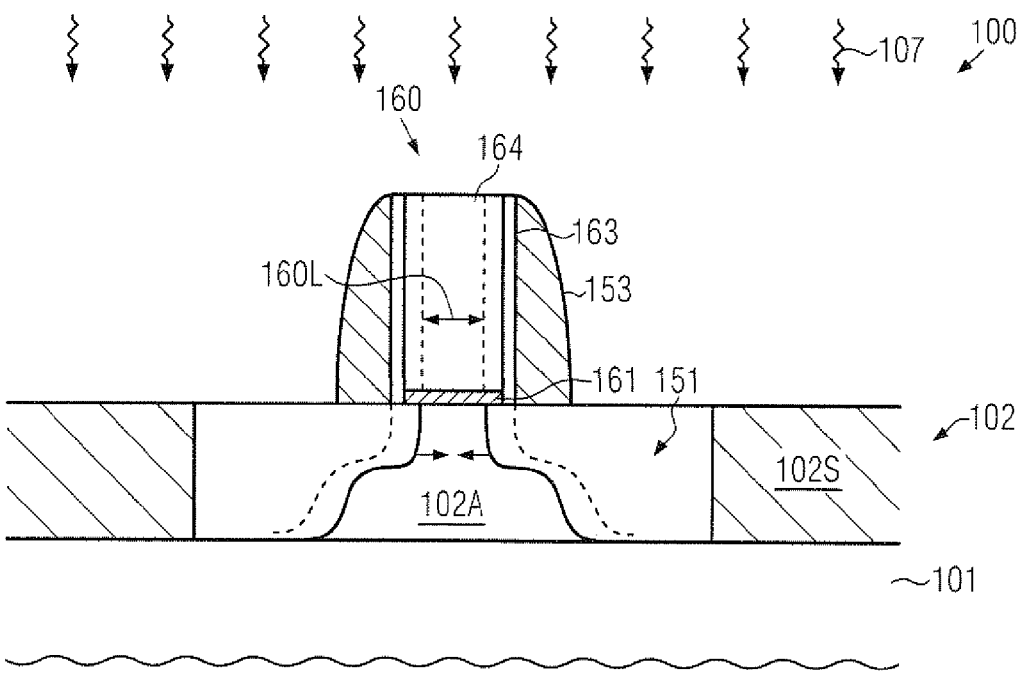

FIG. 1*j* schematically illustrates the semiconductor device 100 during an anneal process 107, during which implantation-induced damage may be re-crystallized and the dopant species of the drain and source regions 151 and of any other implantation regions, such as counter-doped regions or halo regions and the like, may be activated. To this end, any appropriate anneal techniques may be applied, such as rapid thermal anneal, laser-based anneal processes, flashlight-based anneal processes and the like. Moreover, during the anneal process 107, which may comprise two or more individual anneal steps, dopant diffusion may be initiated in accordance with the final gate length 160L. That is, in combination with the preceding implantation processes 105 and 106 (FIGS. 1*h* and 1*i*), the anneal process 107 may result in a desired overlap of the drain and source regions 151 with respect to the gate electrode structure 160, after replacing the placeholder material 164 by using the reverse spacer, which may substantially determine the final gate length 160L, possibly in combination with an additional dielectric material. Consequently, based on a less critical patterning strategy, the placeholder material 164 may be provided in the gate electrode structure 160, while the final gate length 160L may be established in a very late manufacturing stage. On the other hand, an appropriate lateral dopant profile for the drain and source regions 151 may be established by selecting appropriate dimensions of any offset and other spacer structures, in combination with appropriate process parameters of the anneal process 107. Hence, the further processing may be continued, for instance, by forming metal silicide regions and depositing a dielectric material, which may then be planarized so as to expose the surface of the placeholder material 164, which may then be removed, as discussed above.

As a result, the present disclosure provides semiconductor devices and manufacturing techniques in which a replacement gate approach may be applied, wherein a superior cross-sectional shape of the gate opening or trench may be formed, even for highly scaled gate dimensions, by using a reverse spacer to be formed on sidewalls of the gate opening. In some illustrative embodiments, the reverse spacer may additionally be used for defining the desired target gate length, without requiring a more complex patterning strategy upon patterning the placeholder electrode material of the gate electrode structure. Additionally, integrity of the bottom edges of the gate electrode structure may be enhanced upon providing the reverse spacer in the gate opening. Thus, the replacement gate approach may be efficiently applied for even further reduced gate dimensions while significantly increasing gate reliability and overall product reliability.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming an opening in a gate electrode structure of a transistor by removing a placeholder electrode material of said gate electrode structure;
    forming a spacer along exposed sidewalls of said opening;
    after forming said spacer, forming a high-k dielectric material layer at least at a bottom of said opening so as to form a gate dielectric layer; and
    forming a conductive electrode material in said opening.

2. The method of claim 1, wherein forming a conductive electrode material in said opening comprises forming a material layer on said spacers and above a bottom of said opening, wherein said material layer comprises a work function metal species.

3. The method of claim 1, further comprising forming said gate electrode structure so as to comprise a first dielectric material layer and said placeholder electrode material above said first dielectric material layer.

4. The method of claim 3, wherein said high-k dielectric material is formed above said first dielectric material layer.

5. The method of claim 3, wherein forming said spacer comprises forming said spacer from a layer of a conductive material.

6. The method of claim 1, further comprising forming drain and source regions of said transistor prior to forming said opening.

7. The method of claim 6, further comprising forming a dielectric material laterally adjacent to said gate electrode structure prior to forming said opening.

8. The method of claim 6, wherein forming said drain and source regions comprises forming drain and source extension regions so as to define a gate length that is less than a gate length defined by said conductive electrode material.

9. The method of claim 8, wherein said gate length defined by said spacer is 40 nm or less.

10. The method of claim 1, wherein forming said spacer comprises forming a layer of spacer material in said opening and performing an etch process, said etch process exposing a bottom of said opening.

11. A method, comprising:
    forming a gate electrode structure of a transistor on a semiconductor region, said gate electrode structure comprising a placeholder material having a first gate length;
    forming drain and source regions in said semiconductor region based on a second gate length that is less than said first gate length;
    forming an opening in said gate electrode structure by removing at least said placeholder material;
    forming a spacer in said opening so as to reduce lateral dimensions of said opening;
    after forming said spacer, forming a high-k dielectric material layer at least at a bottom of said opening so as to form a gate dielectric layer; and
    forming a conductive electrode material in said opening, said conductive electrode material having said second gate length.

12. The method of claim 11, wherein forming a high-k dielectric material in said opening is performed prior to forming said conductive electrode material.

13. The method of claim 12, wherein said high-k dielectric material and said spacer define said second gate length.

14. The method of claim 11, wherein forming said conductive electrode material comprises forming a work function metal in said opening.

15. The method of claim 11, wherein forming said gate electrode structure comprises forming a first dielectric material layer and forming a layer said placeholder material of said first dielectric material layer.

16. The method of claim 15, wherein forming said spacer comprises performing an etch process and removing a portion of said first dielectric material layer during said etch process.

17. The method of claim 11, wherein said second gate length is 40 nm or less.

18. A method, comprising:
    forming a gate electrode structure of a transistor element above an active region of a semiconductor device, said gate electrode structure comprising a dielectric material layer and a placeholder electrode material formed above said dielectric material layer;
    forming an opening in said gate electrode structure by performing an etch process to selectively remove said placeholder electrode material from said gate electrode structure while using said dielectric material layer as an etch stop;
    forming a layer of spacer material in said opening;

performing an etch process to form a reverse spacer from said layer of spacer material, said reverse spacer being formed adjacent to exposed sidewalls of said opening;

forming a layer of high-k dielectric material along exposed surfaces of said reverse spacer and above a bottom surface of said opening; and forming a conductive electrode material above said layer of high-k dielectric material.

19. The method of claim 18, wherein forming said reverse spacer comprises reducing lateral dimensions of said opening.

20. The method of claim 18, wherein said layer of high-k dielectric material is formed above said dielectric material layer so as to form a gate insulation layer of said transistor element.

* * * * *